United States Patent [19]

Dorinski et al.

[11] Patent Number: 5,001,038

[45] Date of Patent: Mar. 19, 1991

[54] PROCESS FOR PHOTOIMAGING A THREE DIMENSIONAL PRINTED CIRCUIT SUBSTRATE

[75] Inventors: Dale W. Dorinski, Coral Springs; M. William Branan, Jr., Plantation; Glenn F. Urbish, Coral Springs; Anthony B. Suppelsa, Coral Springs; Martin J. McKinley, Sunrise; Douglas W. Hendricks, Boca Raton, all of Fla.

[73] Assignee: Motorola, Inc., Schaumburg, Ill.

[21] Appl. No.: 121,326

[22] Filed: Nov. 16, 1987

[51] Int. Cl.$^5$ .............................................. G03C 5/00
[52] U.S. Cl. ................................... 430/311; 430/319; 430/394; 430/397; 355/40; 355/55
[58] Field of Search ............... 430/311, 319, 394, 397; 355/40, 55

[56] References Cited

U.S. PATENT DOCUMENTS

| | | | |
|---|---|---|---|
| 4,239,790 | 12/1980 | Bosenberg | 427/54.1 |
| 4,346,987 | 8/1982 | Jalichandra et al. | 355/40 |
| 4,377,339 | 3/1983 | Coppock | 355/27 |
| 4,764,450 | 8/1988 | Ruckert et al. | 430/191 |
| 4,837,129 | 6/1989 | Frisch et al. | 430/319 |
| 4,869,999 | 12/1989 | Fukuda et al. | 430/311 |

FOREIGN PATENT DOCUMENTS

| | | | |
|---|---|---|---|
| 160144 | 9/1984 | Japan | 430/5 |
| 42122 | 2/1988 | Japan | |
| 64037 | 3/1988 | Japan | |

OTHER PUBLICATIONS

Paterson, "Automask: A Method to Image . . . 3-D Object", Motorola, TDB, vol. (1), No. 1, Aug. 1980.
Burk et al., "Comparing UV Exposure Systems . . . " National Electronics and Packaging Conf., Anaheim, Calif., Feb. 24-26, 1981.
"UV Exposure Systems", Circuits Manufacturing, vol. 18, No. 5, May 1978, pp. 45-48.

Primary Examiner—Charles L. Bowers, Jr.
Assistant Examiner—Ashley I. Pezzner
Attorney, Agent, or Firm—Daniel K. Nichols

[57] ABSTRACT

Printed circuit patterns are photolithographically defined on a three dimensional "projection" surface (204) of a printed circuit substrate (202) using a projection image aligner and a photomask (210) having a planar image (210A). The geometry of the projection is restricted such that the slope of the projection surface, as measured at any point on the projection surface and relative to a reference plane which is parallel to the focal plane of the projection image aligner, is less than 90 degrees. A solution of photoresist includes a photoresist solvent, a fluorosurfactant and an aromatic hydrocarbon solvent, and is preferably sprayed over the projection surface. In one method of manufacture, the printed circuit substrate is moved from one position to another during the exposure of the photoresist layer (206). In another method, after a first portion of the projection surface is exposed by a first photomask (502), a second photomask (504) is substituted and the remainder of the projection surface exposed. In still another method, a photomask having a plurality of planar images (604A, 604B and 606A) each image being positioned parallel to the others but separated by a small distance, is used to simultaneously exposed the entire projection surface.

3 Claims, 5 Drawing Sheets

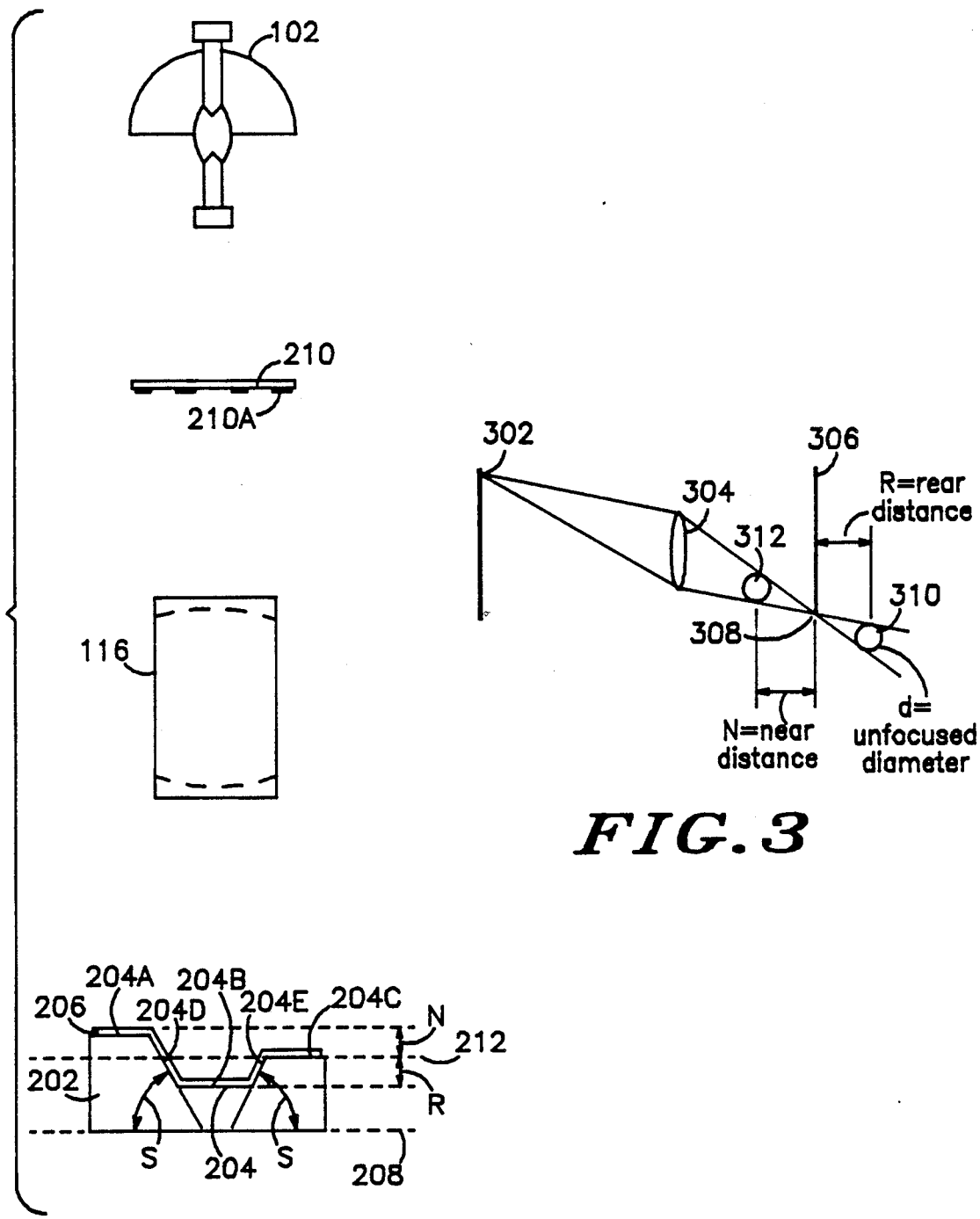

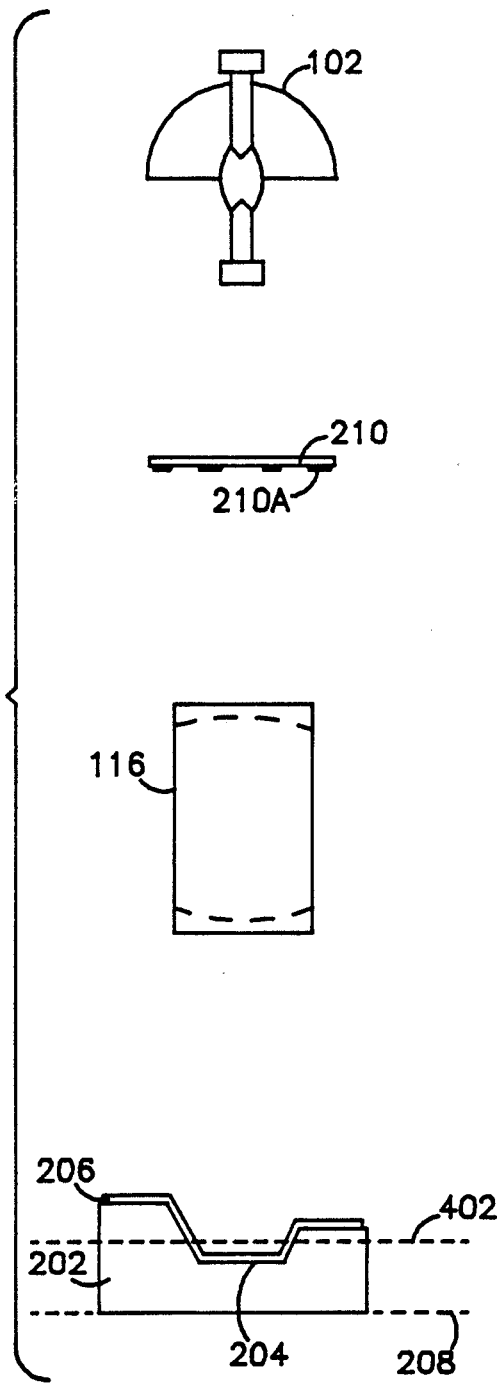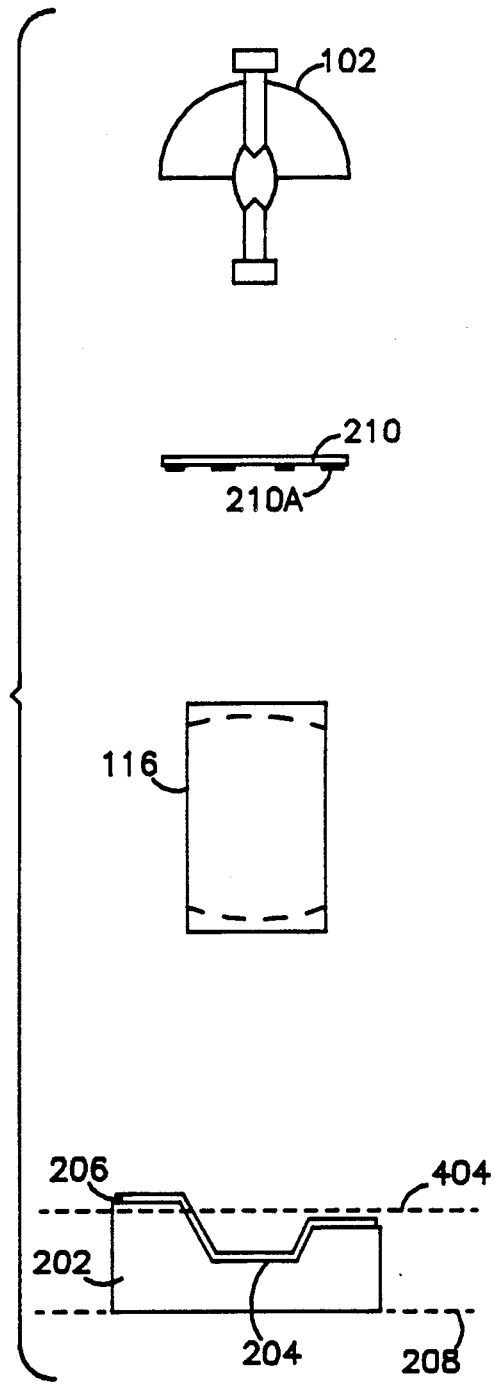
*FIG. 4A*  *FIG. 4B*

PROCESS FOR PHOTOIMAGING A THREE DIMENSIONAL PRINTED CIRCUIT SUBSTRATE

BACKGROUND OF THE INVENTION

This invention pertains to printed circuits, and more particularly to a process for manufacturing a three dimensional printed circuit substrate using a planar mask and image projection photolithography.

To manufacture a conventional printed circuit substrate, a layer of photoresist film is typically bonded over a continuous conductive layer, which is disposed on one surface of a flat substrate. A photographic mask containing the image of a printed circuit pattern is then placed over and in contact with the film of photoresist, and the mask is flooded with an intense light of the proper wavelength. Light passes through the transparent areas of the mask and polymerizes (or depolymerizes, in the case of positive type photoresist) the exposed areas of the photoresist film. The photoresist film is then chemically developed, leaving behind a pattern of photoresist substantially identical to the printed circuit image on the photomask. Through chemical etching, or a combination of electroplating and chemical etching, this printed circuit pattern is then transferred from the photoresist to the conductive layer, resulting in a conductive printed circuit pattern.

The above described process, which is often referred to as contact printing (because the mask is placed in contact with the substrate), works well for flat printed circuit substrates. If the substrate has relief (i.e., is three dimensional) the flat photographic mask used in the contact printing process cannot be placed in contact with all points on the surface of a three dimensional substrate.

Image projection photolithography has been known in the integrated circuit and thin film hybrid art and a block diagram of a typical "projection mask aligner" is illustrated in FIG. 1. Specifically, FIG. 1 is a diagram of Tamarack Scientific Corporation's model 162 Projection Mask Aligner, and this machine can be used, with the appropriate modifications in exposure procedures, to execute the methods described in the "Description of the Preferred Embodiment" below. Referring to this figure, a light source 102 includes a high pressure mercury arc lamp positioned near the focus of an ellipsoidal reflector, which directs the light upward. A dichroic mirror 104 separates the ultraviolet light from the visible and infrared, and reflects the ultraviolet light towards a shutter 106 and a lenticular integrator 108. A turning mirror 110 then reflects the light through a condenser lens 112, whereupon the light strikes photomask 114. Photomask 114 has the image of a circuit pattern on its lower surface, which blocks some of the light coming from condenser 112. The light then passes through a projection lens which focuses the circuit image on the flat surface of an integrated circuit or thin film hybrid 118.

Since mask 114 includes a planar image of the circuit pattern, the projected image on the surface of the integrated circuit or thin film hybrid 118 is only in focus when that surface is positioned precisely at the focal plane of the projection lens 116. If that image where projected onto the surface of a three dimensional substrate, some, if not most, of the points on the surface of the substrate would be out of focus.

Accordingly, it would be desirable if a three dimensional printed circuit substrate surface could be photolithographically defined using a planar image projection system. The methods and apparatus described below accomplish this objective.

SUMMARY OF THE INVENTION

Briefly, the invention is a process for photoimaging a three dimensional printed circuit substrate. A projection imager is provided that includes a light source, a mask having a planar image of a first printed circuit pattern, and a projection lens. Also provided is a three dimensional printed circuit substrate having a projection surface that includes points at varying distances from a reference plane. At any point on the projection surface, the slope of the projection surface relative to the reference plane is less than ninety degrees. A layer of photoresist is then applied over the projection surface. The substrate is positioned at a first position such that the printed circuit pattern image is focused on a first plane that passes through the projection surface. The first plane is parallel to the reference plane. The light source is then activated to expose the projection surface such that the printed circuit pattern image is formed in the layer of photoresist.

BRIEF DESCRIPTION OF THE DRAWINGS

FIG. 2 is a schematic diagram of a projection imager illustrating one method of photoimaging a three dimensional printed circuit substrate.

FIG. 3 is a schematic diagram of a projection lens system illustrating the distortion that result when a point image is projected onto a surface that is positioned out of the plane of focus.

FIGS. 4A and 4B are schematic diagrams of a projection imager and illustrate another method of photoimaging a three dimensional printed circuit substrate in which the substrate is moved during the exposure process.

DESCRIPTION OF THE PREFERRED EMBODIMENT

Three Dimensional Substrate

Figure 1:
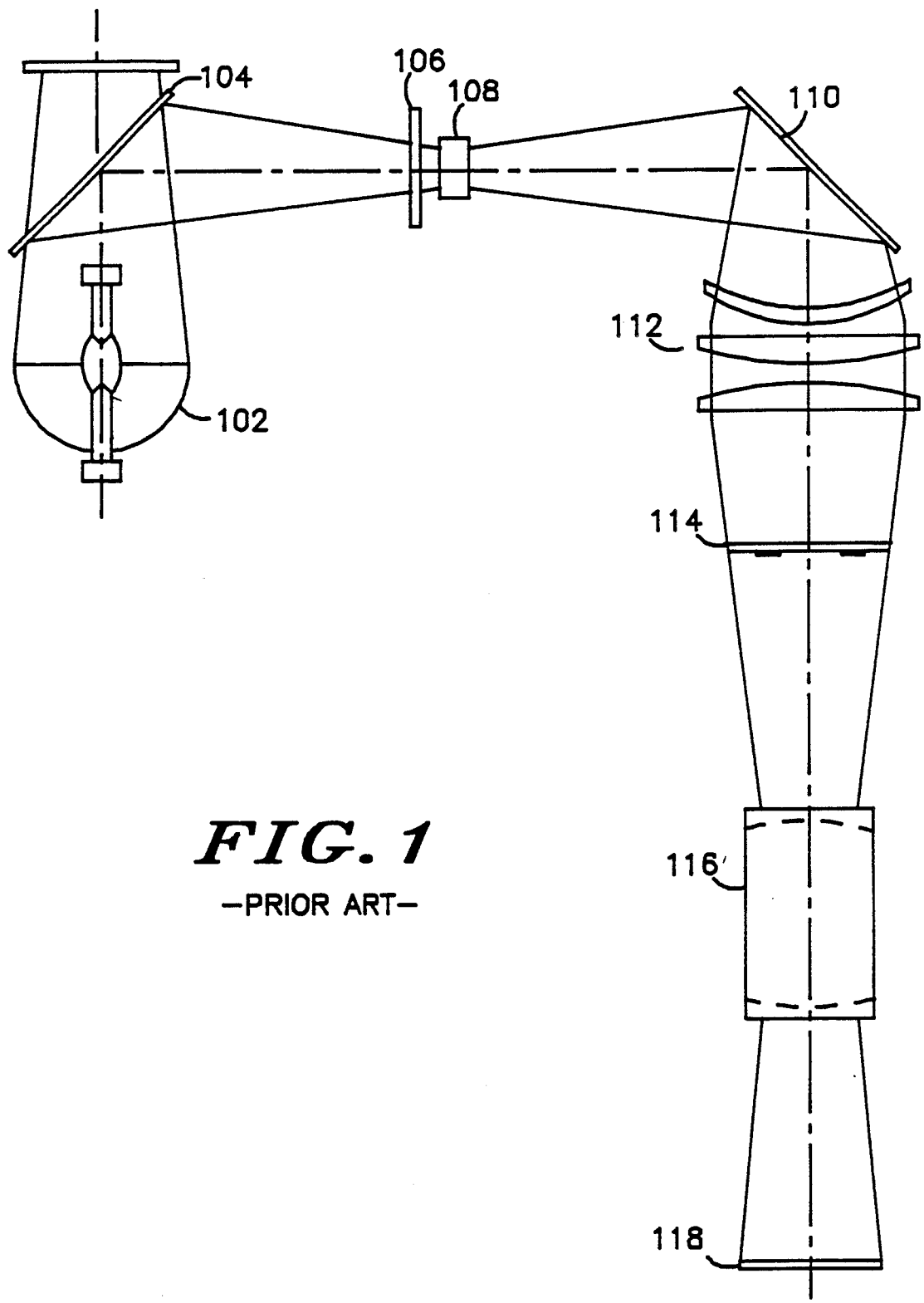
FIG. 1 is a schematic representation of a prior art projection image aligner.

The preferred method of manufacturing a three dimensional substrate is described in a copending application entitled "High Temperature Thermoplastic Substrate Having a Vacuum Deposited Solderable Electrical Circuit Pattern and Method of Manufacture" that was filed on the same date as the present application and which is wholly incorporated by reference herein. To photoimage such a substrate using flat image projection, it is necessary to restrict the geometry of the projection surface (the projection surface is defined as the surface of the substrate onto which printed circuit patterns are imaged). Specifically, at any point on the projection surface, the slope of the projection surface relative to the reference plane (the reference plane being a real or imaginary plane which is positioned parallel to the focal plane) is less than 90 degrees. An example of such a substrate is illustrated in FIG. 2.

Referring to FIG. 2, a three dimensional substrate 202 has a projection surface 204 over which a layer of photoresist 206 is applied. The reference plane at 208 has been arbitrarily selected as the flat bottom surface of the substrate. A mask 210 has a planar image of a printed circuit pattern 210A on its lower surface. The image of the printed circuit pattern 210A is projected onto projection surface 204 (actually, the photoresist layer 206 that covers the projection surface) and is focused on plane 212 which passes through the projection surface. (The distances N and R will be described below with reference to FIG. 3.) The projection surface 204 includes three levels 204A-C that are positioned at varying distances from the reference plane 208. Two sloping sidewalls 204D and E are positioned at an angle S relative to the reference plane. As discussed above, S is less than 90 degrees.

As a practical matter, S should be limited to approximately 70 degrees. Up to 70 degrees, line widths as narrow as 170 microns can easily be photoimaged using the methods of imaging and applying photoresist described below. S, however, can exceed 70 degrees when wider line widths are used and the distance from any point on the projection surface to the focal plane is small. Where two surfaces meet, for example 204A and D, or 204B and E, the junction should be curved with a minimum radius of approximately 100 microns. This improves the uniformity of the thickness of the photoresist layer 206.

Sprayable Photoresist

Photoresist layer 206 is preferably applied by spraying. Dipping, spinning or rolling may also be suitable methods of applying photoresist layer 206, depending on the complexity of the shape of the projection surface. The particular solution of sprayable photoresist described below is necessary to insure that the photoresist does not "dewet" at convex joints (such as the intersections of surfaces 204A and D) or "pool" at concave joints (such as the intersection of 204B and E). Since a molded thermoplastic substrate is more likely to have surface imperfections than an integrated circuit or a thin film hybrid substrate, this solution of sprayable photoresist also prevents dewetting around surface imperfections in the three dimensional substrate.

The solution of sprayable photoresist is prepared by mixing the following chemical compositions in the specified volumetric proportions:

| 1. liquid photoresist | 500 parts | 32.87% |
| 2. photoresist solvent | 1000 parts | 65.75% |
| 3. 1% fluorosurfactant in an aromatic hydrocarbon solvent | 21 parts | 1.38% |

The liquid photoresist is preferably a positive photoresist such as American Hoechst Corporations AZ-4620. The photoresist solvent should have a boiling point between 45 degrees and 70 degrees C. (inclusive). Acetone is the preferred photoresist solvent. The photoresist solvent dilutes the liquid photoresist and reduces its viscosity making it suitable for spraying. The boiling point of the solvent is fairly critical. If a different solvent were used that had a boiling point below 45 degrees, the solvent would evaporate too rapidly during spraying, resulting in uneven coverage. If another solvent were used that had a boiling point above 70 degrees, the liquid photoresist would "puddle" during spraying, resulting in a rough textured layer of photoresist.

The fluorosurfactant is preferably a nonionic solvent soluble fluorosurfactant, such as the 3M Corporation's FC-430. The fluorosurfactant acts as a wetting agent to prevent the sprayable photoresist solution from dewetting around any impurities on the surface of the printed circuit substrate. The aromatic hydrocarbon solvent is preferably an aromatic hydrocarbon blend having a boiling point between 157 degrees and 177 degrees C. (inclusive), such as the Ashland Chemical Corporation's Hi-Sol 10. After spraying, the acetone begins to evaporate first because of its lower boiling temperature, but the aromatic hydrocarbon temporarily remains behind and acts as a leveler, to smooth the surface of the photoresist layer. The boiling point of the aromatic hydrocarbon solvent is also fairly critical. If a different solvent were used that had a higher boiling point, the solvent would be too difficult to remove from the photoresist solution. Although a lower boiling point aromatic hydrocarbon solvent (below 157 degrees C., but above the boiling point of the photoresist solvent) could be used, the higher boiling point range prevents significant changes in the concentration of the fluorosurfactant during use.

The concentration of the fluorosurfactant is very critical. The percentage of fluorosurfactant in the fluorosurfactant/aromatic hydrocarbon solution, and the percentage of fluorosurfactant/aromatic hydrocarbon solution in the overall sprayable photoresist solution, should be maintained within $+/-$ 5%. The apparatus and techniques for spraying photoresist are well known in the art.

The layer of photoresist is preferably dried in three stages in an infra-red oven. The first stage is set to 85 degrees C., the second to 105 degrees C. and the third to 125 degrees C. Total drying time is about 10 minutes with the substrate spending about equal time at each temperature stage.

Photoimaging

In FIG. 2, one method of photoimaging a three dimensional substrate is illustrated. The focal plane 212 of the projection imager is positioned approximately midway between the point or points on the projection surface 204 that are farthest from the reference plane (in the illustration, surface 204A) and the point or points nearest the reference plane (in the illustration, surface 204B). As discussed above, the image projected onto surfaces 204A and B will be out of focus, but the extent to which the image is out of focus may be tolerable. The tolerance for a defocused image is dependent upon the minimum line width of the desired printed circuit conductor, and the extent to which the image will be defocused is primarily dependent upon the distance from the focal plane to the farthest point on the projection surface. This tolerance is quantitatively described below in connection with FIG. 3.

In FIG. 3, a point source of light 302 is focused by a projection lens 304 at the focal plane 306 and, ideally, the focused image is also a point of light 308. If an attempt is made to project the point source 302 on a planar surface a distance R to the rear of focal plane 306, the image 310 is no longer a point, but rather an unfocused circle having a diameter "d". Similarly, if one attempts to project the point source 302 onto a surface positioned a distance "N" in front of focal plane 306, the image 312 is also an unfocused circle having a diameter "d". These distances N and R can be calculated using the following formulas:

$$N = (dfa^2)/(F^2 + fa)$$

$$R = (dfa^2)/(F - dfa)$$

wherein "f" is the "f-number" of the lens, "a" is the object distance (i.e., the distance from the secondary principal plane of the lens to the focal plane) and "F" is the focal length of the lens.

For printed circuit pattern images, the most critical dimension is usually the width of a line, and the defocusing of a point source, specifically the diameter "d", directly correlates with the permissible tolerance for line width. Thus, the diameter "d" determines the resolution of a printed circuit pattern imaging system. More specifically, if a printed circuit conductor line width of 250 microns, +/− 25 microns is desired, then the maximum distance from the focal plane (i.e., N or R) that the image can be projected without exceeding the +/− 25 micron tolerance can be determined by plugging d=25 microns into the above formulas (the other parameters "f", "a" and "F" are dependent upon the particular image projection system being used and are generally known).

Thus, a three dimensional printed circuit substrate can be photoimaged, within the tolerances described above and over a total depth of N+R, by using a photomask having a single planar image, provided the slope of the projection surface is restricted as described above.

When the maximum distance between points on the projection surface and the focal plane exceeds the limit for the desired line width resolution, the method illustrated in FIGS. 4A and 4B can be used. In FIG. 4A, substrate 202 is initially positioned at a first position such that the projected image of printed circuit pattern 210A is focused at a first plane 402 that passes through the projection surface. During the exposure step, the substrate is moved to a second position wherein the projected image of printed circuit pattern 210A is focused at a second plane 404 passing through the projection surface 204. The movement of the substrate can be a smooth, continuous motion, i.e., when exposure begins at the position shown in FIG. 4A, movement of the substrate immediately begins slowly towards the position shown in FIG. 4B, and, upon arriving at the later position, exposure is terminated. Alternatively, the movement of the substrate can be in discrete steps with the substrate spending approximately one half the exposure time at the first position and the remainder of the exposure time at the second position. A similar movement of the photomask or a readjustment of the projection lens would also produce similar results and is considered to be optically equivalent to the movement of the substrate.

Figure 5A:
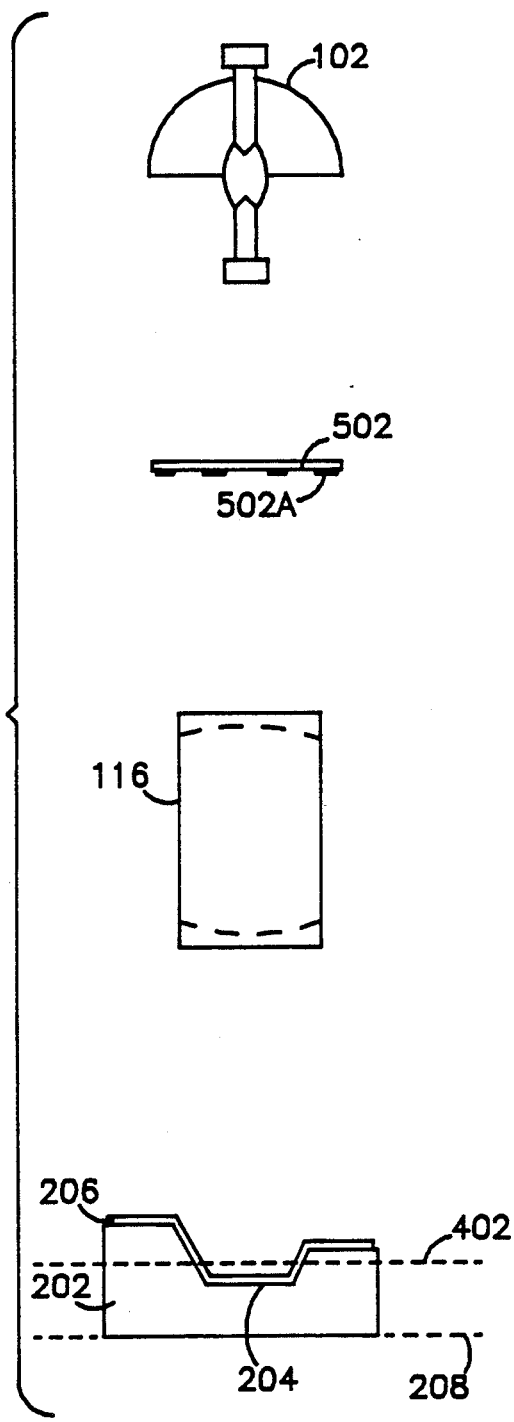
FIGS. 5A and 5B are schematic diagrams of a projection imager and illustrate another method of photoimaging a three dimensional printed circuit substrate in which the substrate is moved during the exposure process and two or more photomasks are used to define the printed circuit pattern.
Figure 5B:
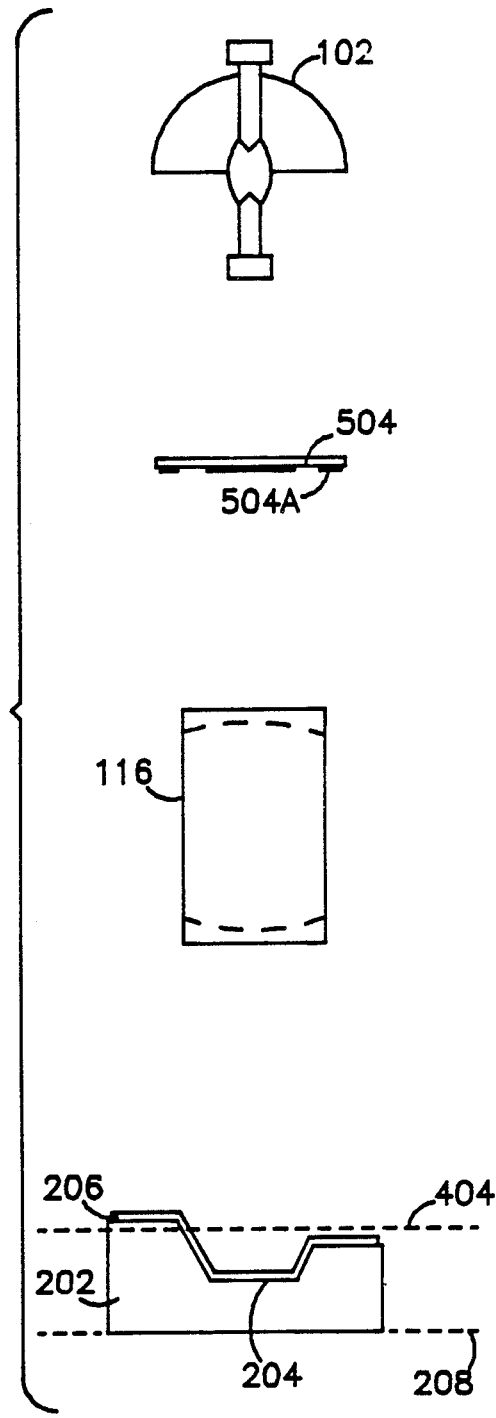

Another method of exposing a three dimensional substrate is illustrated in FIGS. 5A and 5B. In FIG. 5A, the substrate is photoimaged as described in relation to FIG. 4A. Specifically, the printed circuit pattern image 502A is focused on a first plane 402 and the substrate is exposed using mask 502, thereby forming the first printed circuit pattern 502A on the projection surface (more specifically, in the layer of photoresist). In this method, however, a second mask 504 having a second printed circuit pattern image 504A is then substituted for the first mask 502 and the substrate is moved to a second position such that the image 504A is focused at a second plane 404. The substrate is then exposed again, such that the second printed circuit pattern image 504A is formed in the layer of photoresist. In this method, the two printed circuit images 502A and 504A have complementary images, i.e., the first image 502A forms the lower half of the printed circuit pattern on the projection surface, while the second image 504A forms the upper half. If the projection surface has more relief than can be exposed by two masks, the process can be extended to include three or more complementary masks.

Figure 6:
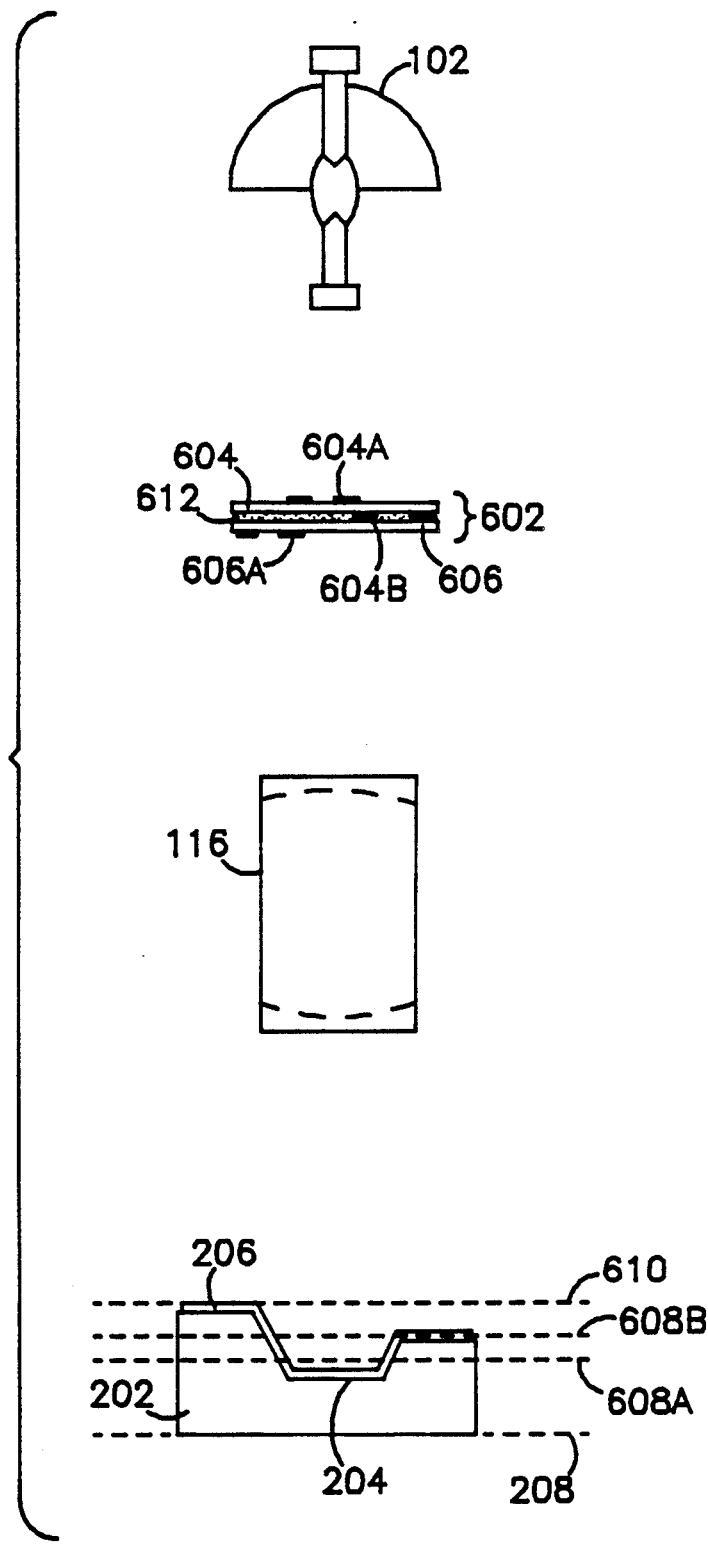
FIG. 6 is a schematic diagram of a projection imager illustrating another method of photoimaging a three dimensional substrate in which a multilayer mask is utilized.

Still another method of photoimaging a three dimensional substrate is illustrated in FIG. 6. Referring to this figure, a mask 602 includes a first transparent sheet 604 that has first 604A and second 604B planar printed circuit pattern images on opposite sides of the first transparent sheet. Since sheet 604 has a finite thickness, the projected images of the printed circuit patterns 604A and 604B will be focused at different focal planes, specifically and respectively, planes 608A and 608B.

If additional planar images are required for higher resolution, a second transparent sheet 606 can be attached to the first transparent sheet 604 by the use of an optical cement 612 having an index of refraction equal to that of the transparent sheets. Sheet 606 has a third planar image of another printed circuit pattern 606A and is positioned parallel to the planar images on the first transparent sheet 604. The third printed circuit pattern image 606A will also be projected to a different focal plane, specifically 610.

The transparent sheets are preferably made from glass of an optical quality that will not significantly absorb the particular wavelength of light that the photoresist is sensitive to. These glass materials are well known in the art of photoimaging integrated circuits and thin film hybrids.

Regardless of the particular method used to photoimage the substrate, the next steps in the production of the printed circuit substrate are the development of the photoresist and the actual formation of the printed circuit conductors. One method of performing these steps is discussed in the above referenced co-pending application, although other well known techniques may also be used. The final result is a three dimensional substrate having a projection surface (as described above) with a photolithographically defined electrical printed circuit pattern disposed on the projection surface. Such a substrate with photolithographically defined printed circuit conductors is illustrated in a copending application entiled "Moldable/Foldable Radio Housing" that was filed on the same date as the present application and which is wholly incorporated by reference herein.

We claim as our invention:

1. The photoimaging process of claim 1, further comprising the steps of:

substituting, for said first mask, a second mask having an image of a second printed circuit pattern;

repositioning said substrate to a second position wherein said second printed circuit pattern image is focused on a second plane; and exposing said projection surface such that said second printed circuit pattern image is formed in said layer of photoresist.

2. A process for photoimaging a three dimensional printed circuit substrate, comprising the steps of:
providing a projection imager including a light source, a mask having a first planar image of a first printed circuit pattern and a second planar image of a second printed circuit pattern, said second planar image being positioned parallel to said first planar image, and a projection lens;
providing a three dimensional printed circuit substrate having a projection surface that includes points at varying distances from a reference plane, and at any point on said projection surface the slope of said projection surface relative to said reference plane is less than ninety degrees;
applying a layer of photoresist over said projection surface;
positioning said substrate at a first position such that said first printed circuit pattern image is focused on a first plane and said second printed circuit pattern is focused on a second plane; and
activating said light source and exposing said projection surface such that said first and said second printed circuit pattern images are formed in said layer of photoresist;
said mask including a transparent sheet having said first and second printed circuit pattern images disposed on opposite sides of said sheet.

3. A process for photoimaging a three dimensional printed circuit substrate, comprising the steps of:
providing a projection imager including a light source, a mask having a first planar image of a first printed circuit pattern and a second planar image of a second printed circuit pattern, said second planar image being positioned parallel to said first planar image, and a projection lens;
providing a three dimensional printed circuit substrate having a projection surface that includes points at varying distances from a reference plane, and at any point on said projection surface the slope of said projection surface relative to said reference plane is less than ninety degrees;
applying a layer of photoresist over said projection surface;
positioning said substrate at a first position such that said first printed circuit pattern image is focused on a first plane and said second printed circuit pattern image is focused on a second plane; and
activating said light source and exposing said projection surface such that said first and said second printed circuit pattern images are formed in said layer of photoresist;
said mass including first and second transparent sheets, each of said sheets having first and second opposing surfaces, said first an second printed circuit pattern images being disposed respectively on said first surfaces of said first and second transparent sheets, said first surface of said first transparent sheet being attached to said second surface of said second transparent sheet.

* * * * *

UNITED STATES PATENT AND TRADEMARK OFFICE
CERTIFICATE OF CORRECTION

PATENT NO. : 5,001,038

DATED : March 19, 1991

INVENTOR(S) : Dale W. Dorinski, et al

It is certified that error appears in the above-identified patent and that said Letters Patent is hereby corrected as shown below:

<u>COLUMN 6, LINES 59-68:</u>

Delete claim 1 and insert therefor:

-- 1. A process for photoimaging a three dimensional printed circuit substrate, comprising the steps of:

provinding a projection imager including a light source, a mask having a planar image of a first printed circuit pattern, and a projection lens;

providing a three dimensional printed circuit substrate having a projection surface that includes points at varying distances from a reference plane, and at any point on said projection surface the slope of said projection surface relative to said reference plane is less than ninety degrees;

applying a layer of photoresist over said projection surface;

positioning said substrate at a first position such that said first printed circuit pattern image is focused on a first plane;

activating said light source and exposing said projection surface such that said first printed circuit pattern image is formed in said layer of photoresist;

substituting a second mask for said first mask, said second mask having an image of a second printed circuit pattern;

repositioning said substrate to a second position wherein said second printed circuit pattern image is focused on a second plane; and exposing said projection surface such that said second printed circuit pattern image is formed in said layer of photoresist. --.

UNITED STATES PATENT AND TRADEMARK OFFICE
CERTIFICATE OF CORRECTION

PATENT NO. : 5,001,038
DATED : March 19, 1991
INVENTOR(S) : Dale W. Dorinski, et. al.

It is certified that error appears in the above-identified patent and that said Letters Patent is hereby corrected as shown below:

Claim 3, col. 8, line 23, delete "mass" and insert therefor -- mask --.

Signed and Sealed this

Twenty-ninth Day of December, 1992

*Attest:*

DOUGLAS B. COMER

*Attesting Officer*  *Acting Commissioner of Patents and Trademarks*